(12) United States Patent
Black et al.

(10) Patent No.: US 10,250,375 B2
(45) Date of Patent: Apr. 2, 2019

(54) CLOCK SYNCHRONIZATION (71) Applicant: QUALCOMM Incorporated, San Diego, CA (US)

(72) Inventors: Justin Black, Santa Clara, CA (US); Cheng-Han Wang, San Jose, CA (US); Jeongsik Yang, San Jose, CA (US)

(73) Assignee: QUALCOMM Incorporated, San Diego, CA (US)

( * ) Notice: Subject to any disclaimer, the term of this patent is extended or adjusted under 35 U.S.C. 154(b) by 178 days.

(21) Appl. No.: 15/273,015

(22) Filed: Sep. 22, 2016

(65) Prior Publication Data
US 2018/0083763 A1    Mar. 22, 2018

(51) Int. Cl.
| | |
|---|---|
| H04L 7/00 | (2006.01) |
| H03K 19/21 | (2006.01) |
| H03L 7/00 | (2006.01) |
| H03L 7/081 | (2006.01) |
| H03L 7/14 | (2006.01) |
| H03L 7/22 | (2006.01) |
| H04W 52/02 | (2009.01) |

(52) U.S. Cl.
CPC .......... *H04L 7/0008* (2013.01); *H03K 19/21* (2013.01); *H03L 7/00* (2013.01); *H03L 7/0812* (2013.01); *H03L 7/143* (2013.01); *H03L 7/22* (2013.01); *H04W 52/02* (2013.01)

(58) Field of Classification Search
CPC .......... H04L 7/0008; H03K 19/21; H03L 7/00
USPC ......... 327/144–153, 156–159; 375/371–376; 331/1 A
See application file for complete search history.

(56) References Cited

U.S. PATENT DOCUMENTS

| | | | |
|---|---|---|---|
| 5,373,254 A * | 12/1994 | Nakauchi ................ | H03L 7/143 331/1 A |
| 5,834,956 A | 11/1998 | Pathikonda et al. | |
| 6,289,067 B1 | 9/2001 | Nguyen et al. | |
| 8,259,886 B2 | 9/2012 | Konishi et al. | |
| 8,461,933 B2 | 6/2013 | Cho et al. | |
| 9,490,826 B1 | 11/2016 | Wang et al. | |
| 2009/0002080 A1 | 1/2009 | Kim | |
| 2015/0296452 A1 | 10/2015 | Hu et al. | |

OTHER PUBLICATIONS

International Search Report and Written Opinion—PCT/US2017/049595—ISA/EPO—dated Nov. 27, 2017.

* cited by examiner

*Primary Examiner* — Thomas Skibinski
(74) *Attorney, Agent, or Firm* — Paradice and Li LLP/Qualcomm (57) ABSTRACT

An apparatus and a method are disclosed for synchronizing clock signals distributed within a wireless device. In some embodiments, a local oscillator (LO) clock signal is buffered and distributed to two or more transceivers within the wireless device. Each transceiver may include a configurable clock divider to divide the distributed LO clock signal and generate an output clock signal. A phase detector compares output clock signals from each of the configurable clock dividers and generates an output signal in accordance with a determined phase difference. The phase detector output signal may cause at least one of the configurable clock dividers to modify its respective output clock signal, and thereby synchronize output clock signals between different configurable clock dividers. In some embodiments, a clock signal from a configurable clock divider may be modified (shifted) by approximately 90 or 180 degrees.

21 Claims, 9 Drawing Sheets

CLOCK SYNCHRONIZATION

TECHNICAL FIELD

The example embodiments relate generally to communication devices, and specifically to controlling clock phases of two or more clock signals distributed within a communication device.

BACKGROUND OF RELATED ART

Communication devices often use clock signals to control synchronous circuits. The clock signals may be distributed throughout the communication device through dividers, buffers, repeaters, and/or other suitable circuits. For example, a communication device may include a clock synthesizer to generate a root clock signal. The root clock signal may be processed by a frequency divider to divide a frequency of the root clock signal by two and create a clock signal with a 50% duty cycle. The clock signal may then be distributed through clock buffers and/or clock repeaters to circuits within the communication device.

Some communication devices may include multiple wireless transmitters to transmit multiple data streams, and may include multiple wireless receivers to receive multiple data streams, for example, to increase communication bandwidth. These communication devices, which may operate in multiple-input multiple-output (MIMO) systems, typically offer increased peak data rates, increased spectral efficiency, and increased quality of service by communicating with each other using a plurality of parallel data streams (e.g., as compared with communication devices that transmit a single data stream).

Communication devices operating in MIMO systems may include a plurality of radio frequency (RF) transmit chains, each of which may transmit a corresponding one of a plurality of data streams. For multiple transmit chains to transmit multiple data streams at the same time, it is important that the clock signals provided to the multiple transmit chains are (and remain) synchronized with each other. Thus, there is a need to improve timing synchronization between clock signals provided to multiple transmit chains of a communication device that operates in a MIMO system.

SUMMARY

This Summary is provided to introduce in a simplified form a selection of concepts that are further described below in the Detailed Description. This Summary is not intended to identify key features or essential features of the claimed subject matter, nor is it intended to limit the scope of the claimed subject matter.

Apparatuses and methods are disclosed that may allow synchronization of clock signals generated by a common clock synthesizer and distributed to two or more regions or areas in a wireless device. In one example, an apparatus may include a first circuit to generate a clock inhibit signal and a second circuit to generate a divided clock signal based, at least in part on a clock select signal and the clock inhibit signal.

In another example, a method for synchronizing a first clock signal and a second clock signal is disclosed. The method may include generating a clock inhibit signal and generating a divided clock signal based, at least in part, on a clock select signal and the clock inhibit signal.

In another example, an apparatus is disclosed. The apparatus may comprise means for generating a clock inhibit signal and means for generating a divided clock signal based, at least in part, on a clock select signal and the clock inhibit signal.

In another example, an apparatus for generating quadrature clock signals is disclosed. The apparatus may include a first output to generate an in-phase clock signal based, at least in part, on a clock selection signal to select a first gated clock signal or a second gated clock signal and a second output to generate an inverse in-phase clock signal based, at least in part, on the clock selection signal to select the first gated clock signal or the second gated clock signal.

BRIEF DESCRIPTION OF THE DRAWINGS

The example embodiments are illustrated by way of example and are not intended to be limited by the figures of the accompanying drawings. Like numbers reference like elements throughout the drawings and specification.

DETAILED DESCRIPTION

The example embodiments are described below in the context of Wi-Fi enabled devices for simplicity only. It is to be understood that the example embodiments are equally applicable for devices using signals of other various wireless standards or protocols. As used herein, the terms "wireless local area network (WLAN)" and "Wi-Fi" can include communications governed by the IEEE 802.11 standards, BLUETOOTH®, HiperLAN (a set of wireless standards, comparable to the IEEE 802.11 standards, used primarily in Europe), and other technologies used in wireless communications (e.g., ZigBee and WiGig).

In the following description, numerous specific details are set forth such as examples of specific components, circuits, and processes to provide a thorough understanding of the present disclosure. The term "coupled" as used herein means coupled directly to or coupled through one or more intervening components or circuits. Also, in the following description and for purposes of explanation, specific nomenclature is set forth to provide a thorough understanding of the example embodiments. However, it will be apparent to one skilled in the art that these specific details may not be required to practice the example embodiments. In other instances, well-known circuits and devices are shown in block diagram form to avoid obscuring the present disclosure. Any of the signals provided over various buses described herein may be time-multiplexed with other signals and provided over one or more common buses. Additionally, the interconnection between circuit elements or software blocks may be shown as buses or as single signal lines. Each of the buses may alternatively be a single signal line, and each of the single signal lines may alternatively be buses, and a single line or bus might represent any one or more of a myriad of physical or logical mechanisms for communication between components. The example embodiments are not to be construed as limited to specific examples described herein but rather to include within their scope all embodiments defined by the appended claims.

Figure 1:
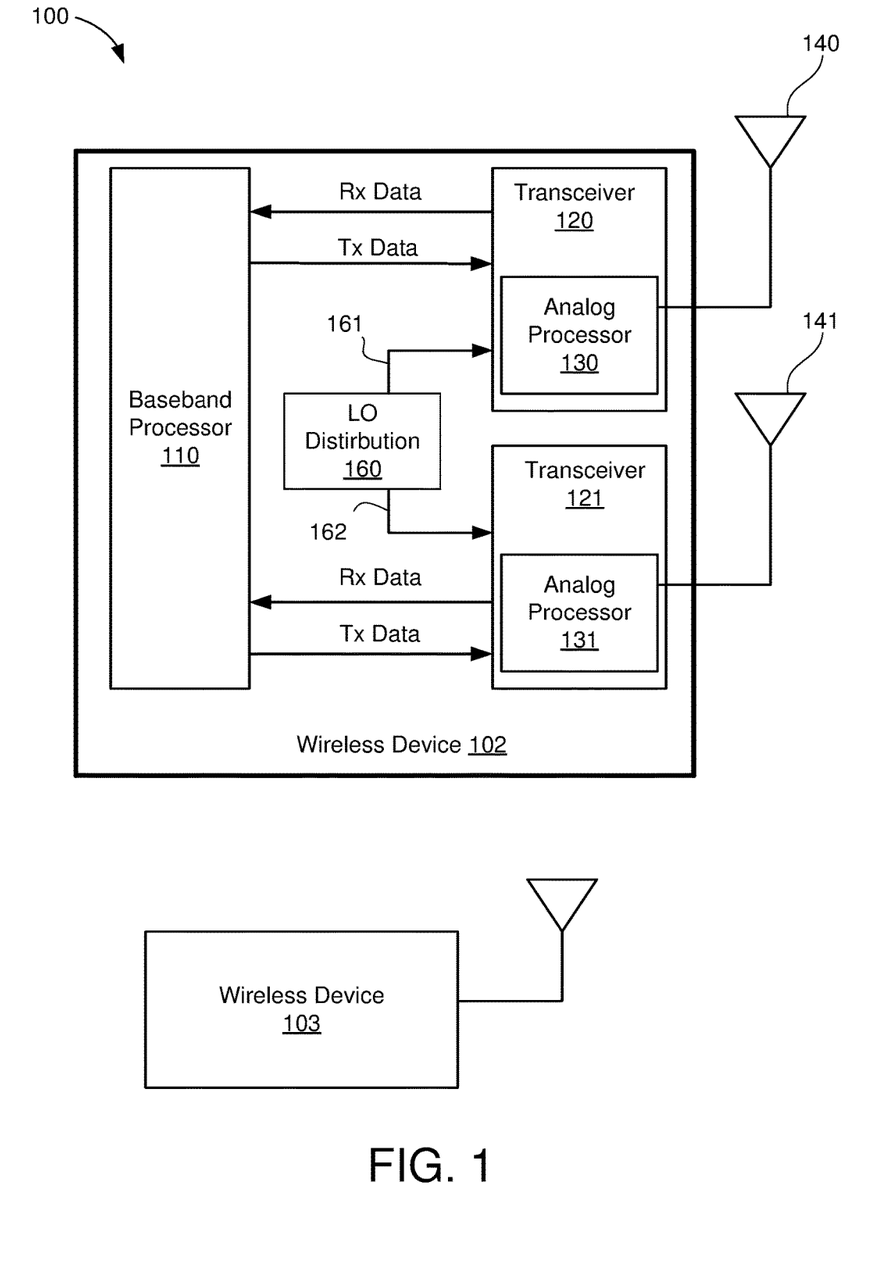
FIG. 1 shows an example communication system within which example embodiments may be implemented.

FIG. 1 shows an example communication system 100 within which example embodiments may be implemented. The communication system 100 may include wireless devices 102 and 103. Although only two wireless devices 102 and 103 are shown in FIG. 1 for simplicity, it is to be understood that the communication system 100 may include any number of wireless devices. The wireless devices 102 and 103 may be any suitable wireless enabled device including, for example, a cell phone, laptop, tablet computer, wireless access point, or the like. Each of the wireless devices 102 and 103 may also be referred to as a user equipment (UE), a subscriber station, a mobile unit, a subscriber unit, a wireless unit, a remote unit, a mobile device, a wireless device, a wireless communications device, a remote device, a mobile subscriber station, an access terminal, a mobile terminal, a wireless terminal, a remote terminal, a handset, a user agent, a mobile client, a client, or some other suitable terminology.

For at least some embodiments, each of the wireless devices 102 and 103 may include one or more processing resources (e.g., processors and/or ASICs), one or more memory resources, and a power source (e.g., a battery). The memory resources may include a non-transitory computer-readable medium (e.g., one or more nonvolatile memory elements, such as EPROM, EEPROM, Flash memory, a hard drive, etc.) that stores instructions for performing operations described below with respect to FIG. 8.

The wireless device 102 may include a first transceiver 120, a second transceiver 121, a first antenna 140, a second antenna 141, a local oscillator (LO) distribution circuit 160, and a baseband processor 110. The first transceiver 120 may be a Wi-Fi transceiver, a Bluetooth transceiver, a cellular transceiver, and/or other suitable radio frequency (RF) transceiver (each distinct transceiver not shown for simplicity). The first transceiver 120 may communicate with other wireless devices within distinct operating frequency bands and/or using distinct communication protocols. For example, a Wi-Fi transceiver may communicate within a 2.4 GHz frequency band and/or within a 5 GHz frequency band in accordance with the IEEE 802.11 specification. A cellular transceiver may communicate within various RF frequency bands in accordance with a 4G Long Term Evolution (LTE) protocol described by the 3rd Generation Partnership Project (3GPP) (e.g., between approximately 700 MHz and approximately 3.9 GHz) and/or in accordance with other cellular protocols (e.g., a Global System for Mobile (GSM) communications protocol). In other embodiments, the first transceiver 120 may be any technically feasible transceiver such as a ZigBee transceiver described by a specification from the ZigBee Alliance, a WiGig transceiver, and/or a HomePlug transceiver described by a specification from the HomePlug Alliance.

The LO distribution circuit 160 may generate a first clock signal 161 that may be used to modulate and/or demodulate data within the first transceiver 120. The first transceiver 120 may include a first analog processor 130, and may be coupled to the first antenna 140. The first transceiver 120 may transmit and receive data through a wireless communication medium via the first antenna 140. The baseband processor 110, which is coupled to the first transceiver 120, may generate and/or receive baseband data including, for example, Wi-Fi, cellular, ZigBee, WiGig, and/or any technically feasible baseband data. In some aspects, the baseband processor 110 may provide transmit data (Tx Data) to and receive data (Rx data) from the first transceiver 120. The first analog processor 130 may include a configurable LO divider (not shown for simplicity) to divide and/or condition the first clock signal 161.

The second transceiver 121 may be similar to the first transceiver 120. For example, the second transceiver 121 may include a second analog processor 131 and may allow the wireless device 102 to transmit and receive data through the wireless communication medium via the second antenna 141. The baseband processor 110 may provide Tx data to and receive Rx data from the second transceiver 121. The second analog processor 131 may also include a configurable LO divider (not shown for simplicity) to divide and/or condition a second clock signal 162.

Although only two transceivers 120 and 121 are shown in FIG. 1, the wireless device 102 may include any technically feasible number of transceivers. The wireless device 103 may be similar to the wireless device 102. For example, the wireless device 103 may also include a plurality of transceivers, a plurality of antennas, a baseband processor, and an LO distribution circuit (not shown in FIG. 1 for simplicity).

Figure 2:
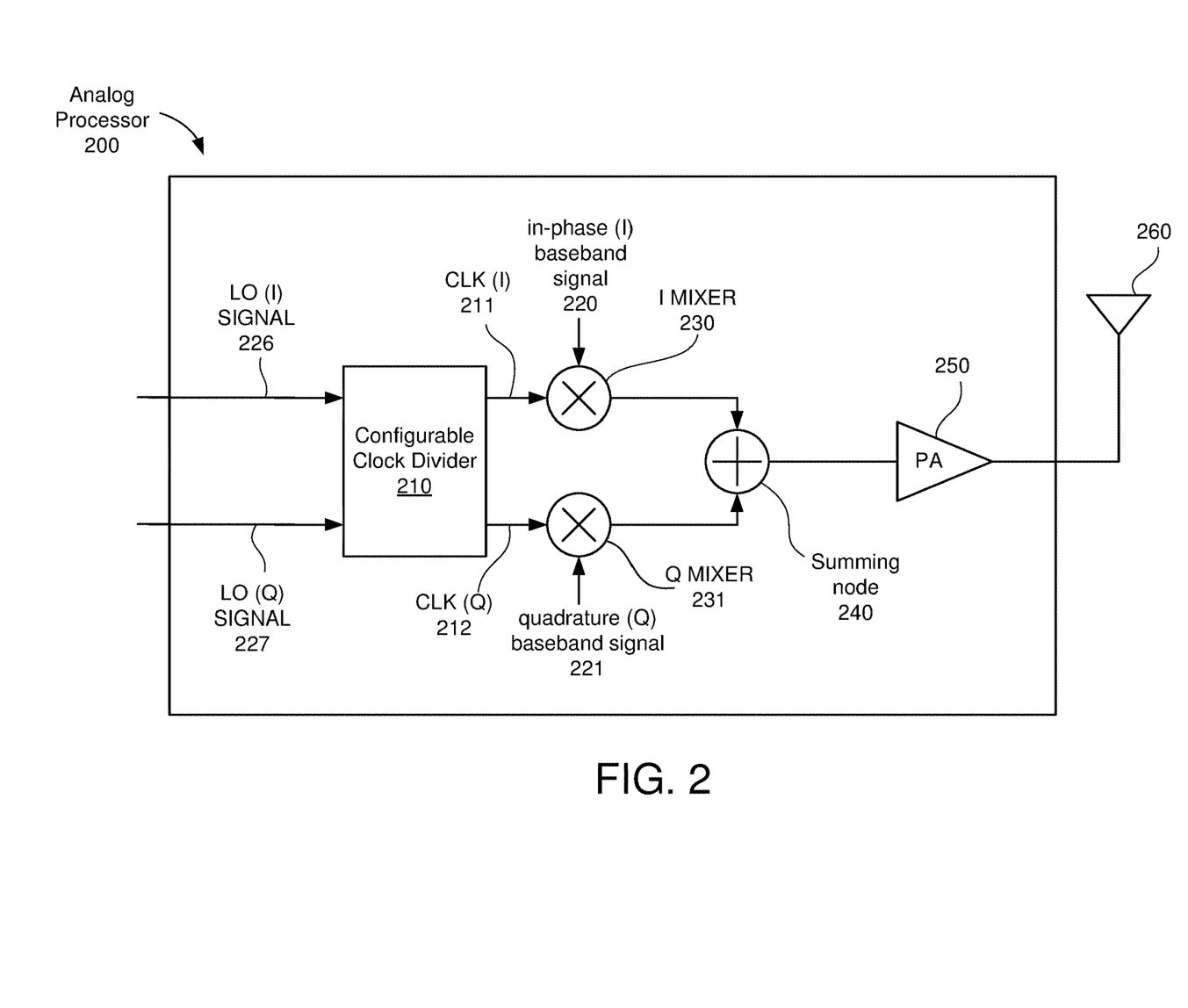
FIG. 2 shows an example block diagram of an analog processor of FIG. 1.

FIG. 2 shows an example block diagram of an analog processor 200. The analog processor 200 may be an example embodiment of the first analog processor 130 and/or the second analog processor 131 of FIG. 1. The analog processor 200 may include a configurable clock divider 210, an in-phase (I) mixer 230, a quadrature (Q) mixer 231, a summing node 240, a power amplifier (PA) 250, and an antenna 260. The antenna 260 may be an example embodiment of the first antenna 140 and/or the second antenna 141 of FIG. 1. The configurable clock divider 210 may receive an in-phase LO signal (denoted as LO (I) signal) 226 and a quadrature LO signal (denoted as LO (Q) signal) 227. The LO clock signals 226 and 227 may be the first clock signal 161 or the second clock signal 162 of FIG. 1, and may be generated by the LO distribution circuit 160 of FIG. 1. In some embodiments, the LO (I) signal 226 and the LO (Q) signal 227 may be related in phase to each other. For example, the LO (Q) signal 227 may be a 90 degree phase shifted version of the LO (I) signal 226. In some embodiments, LO (I) signal 226 and LO (Q) signal 227 may have a frequency associated with a carrier frequency.

The configurable clock divider 210 may divide the frequency of the LO (I) signal 226 and the LO (Q) signal 227. For example, the configurable clock divider 210 may generate a CLK (I) signal 211 by dividing the LO (I) signal 226, and may generate a CLK (Q) signal 212 by dividing the LO (Q) signal 227. The CLK (I) signal 211 may be coupled to the I mixer 230. The I mixer 230 may "mix" (e.g., multiply two signals together) the CLK (I) signal 211 and an I baseband signal 220 received from the baseband processor 110 of FIG. 1. In a similar manner, the Q mixer 231 may mix together the CLK (Q) signal 212 and a Q baseband signal 221 received from baseband processor 110 of FIG. 1. Output signals provided by the I mixer 230 and the Q mixer 231 may be summed together by the summing node 240 to generate a RF signal, which in turn may be amplified by the PA 250 before being transmitted via antenna 260 (e.g., to one or more other wireless devices).

In some embodiments, the analog processor 200 may be one of several analog processors included in a wireless device. For example, the first analog processor 130 and the second analog processor 131 of FIG. 1 may each be different instantiations of the analog processor 200. Thus, the output signal of a first instantiation of the configurable clock divider 210 may be out of phase with respect to the output signal of a second instantiation of the configurable clock divider 210. In some embodiments, the configurable clock divider 210 may include a clock conditioner circuit to process and synchronize clock signals between different configurable analog processors. Clock conditioners are described in more detail below in conjunction with FIGS. 3 and 4.

Figure 3:
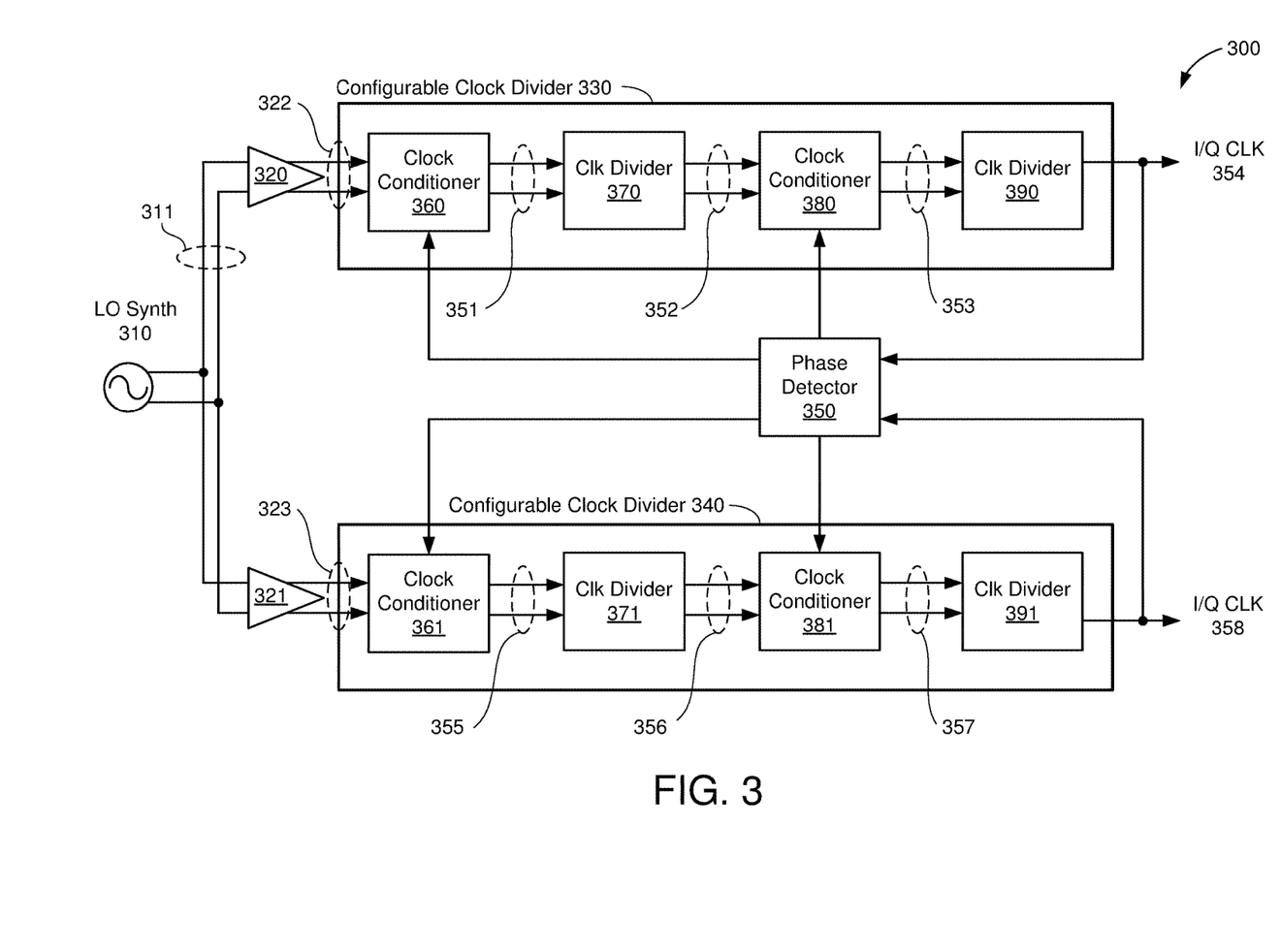
FIG. 3 is a block diagram of a local oscillator (LO) distribution circuit in accordance with example embodiments.

FIG. 3 depicts a block diagram of an LO distribution circuit 300 in accordance with some embodiments. The LO distribution circuit 300 may be an example embodiment of the LO distribution circuit 160 of FIG. 1. In some embodiments, operation of multiple transceivers within a wireless device may be based on a common LO synthesizer. The LO synthesizer may generate a root LO clock signal that may be processed and/or distributed to the multiple transceivers. Processing and distributing the LO clock signals may be performed by the LO distribution circuit 300. The LO distribution circuit 300 may include an LO synthesizer 310, a first buffer 320, a second buffer 321, a first configurable clock divider 330, a second configurable clock divider 340, and a phase detector 350. In some embodiments, the first configurable clock divider 330 may be associated with a first transceiver such as, for example, the first transceiver 120 of FIG. 1, and the second configurable clock divider 340 may be associated with a second transceiver such as, for example, the second transceiver 121 of FIG. 1.

The LO synthesizer 310 may generate a root clock signal 311. The root clock signal 311 may be a single-ended signal or a differential signal, and may include both in-phase and quadrature components (not shown for simplicity). The root clock signal 311 may be buffered by the first buffer 320 and the second buffer 321. In some embodiments, the first buffer 320 and the second buffer 321 may each be associated with a different signal delay time. The different signal delay times may be due to signal routing (e.g., path length), signal processing (e.g., clock dividers), device characteristics of the first buffer 320 and the second buffer 321, and/or any other technically feasible reason. The first buffer 320 may provide a first buffered root clock signal 322 to the first configurable clock divider 330.

The first configurable clock divider 330 may include a first clock conditioner 360, a first clock divider circuit 370, a second clock conditioner 380, and a second clock divider circuit 390. The first clock conditioner 360 may receive the first buffered root clock signal 322. The first clock conditioner 360 may process (e.g., shift, invert, and/or gate) the first buffered root clock signal 322 and provide a first processed clock signal 351 to the first clock divider circuit 370. The first clock divider circuit 370 may divide the frequency of the first processed clock signal 351 and generate a first divided clock signal 352. The first divided clock signal 352 may be received by the second clock conditioner 380. The second clock conditioner 380 may process (e.g., shift, invert, and/or gate) the first divided clock signal 352 and provide a second processed clock signal 353 to the second clock divider circuit 390. The second clock divider circuit 390 may further divide the frequency of the second processed clock signal 353 and generate a first I/Q clock signal 354.

The second configurable clock divider 340 may be similar to the first configurable clock divider 330. The second configurable clock divider 340 may include a third clock conditioner 361, a third clock divider circuit 371, a fourth clock conditioner 381, and a fourth clock divider circuit 391. The third clock conditioner 361 may receive a second buffered root clock signal 323. The third clock conditioner 361 may process (e.g., shift, invert, and/or gate) the second buffered root clock signal 323 and provide a third processed clock signal 355 to the third clock divider circuit 371. The third clock divider circuit 371 may divide the frequency of the third processed clock signal 355 and generate a second divided clock signal 356. The second divided clock signal 356 may be received by the fourth clock conditioner 381. The fourth clock conditioner 381 may process (e.g., shift, invert, and/or gate) the second divided clock signal 356 and provide a fourth processed clock signal 357 to the fourth clock divider circuit 391. The fourth clock divider circuit 391 may further divide the frequency of the fourth processed clock signal 357 and generate a second I/Q clock signal 358.

The first clock conditioner 360, the first clock divider circuit 370, the second clock conditioner 380, and the second clock divider circuit 390 may delay, shift, and/or invert the first I/Q clock signal 354 with respect to the second I/Q clock signal 358. In a similar manner, the third clock conditioner 361, the third clock divider circuit 371, the fourth clock conditioner 381, and the fourth clock divider circuit 391 may delay, shift, and/or invert the second I/Q clock signal 358 with respect to the first I/Q clock signal 354. In other words, the first I/Q clock signal 354 may be adjusted to match the phase of the second I/Q clock signal 358 and/or the second I/Q clock signal 358 may be adjusted to match the phase of the first I/Q clock signal 354. For example, the first clock conditioner 360 may remove one or more clock cycles from the first buffered root clock signal 322 to generate the first processed clock signal 351. Further, the second clock conditioner 380 may remove one or more clock cycles from the first divided clock signal 352. Additionally, the second clock conditioner 380 may also swap, shift, and/or invert clock signals provided to the second clock divider circuit 390. In this manner, the phase of the first I/Q clock signal 354 may be adjusted. The third clock conditioner 361, the third clock divider circuit 371, the fourth clock conditioner 381, and the fourth clock divider circuit 391 may delay, shift, and/or invert the second I/Q clock signal 358 in a similar manner. Operation of the first clock conditioner 360, the second clock conditioner 380, the third clock conditioner 361, and the fourth clock conditioner 381 is described in more detail below in conjunction with FIGS. 4A and 5.

The phase detector 350 may monitor the first I/Q clock signal 354 and the second I/Q clock signal 358. The phase detector 350 may cause the first configurable clock divider 330 and/or the second configurable clock divider 340 to shift, delay, and/or invert their respective I/Q clock signals. Operation of the phase detector 350 is described in more detail below in conjunction with FIGS. 4A and 4B.

Figure 4A:
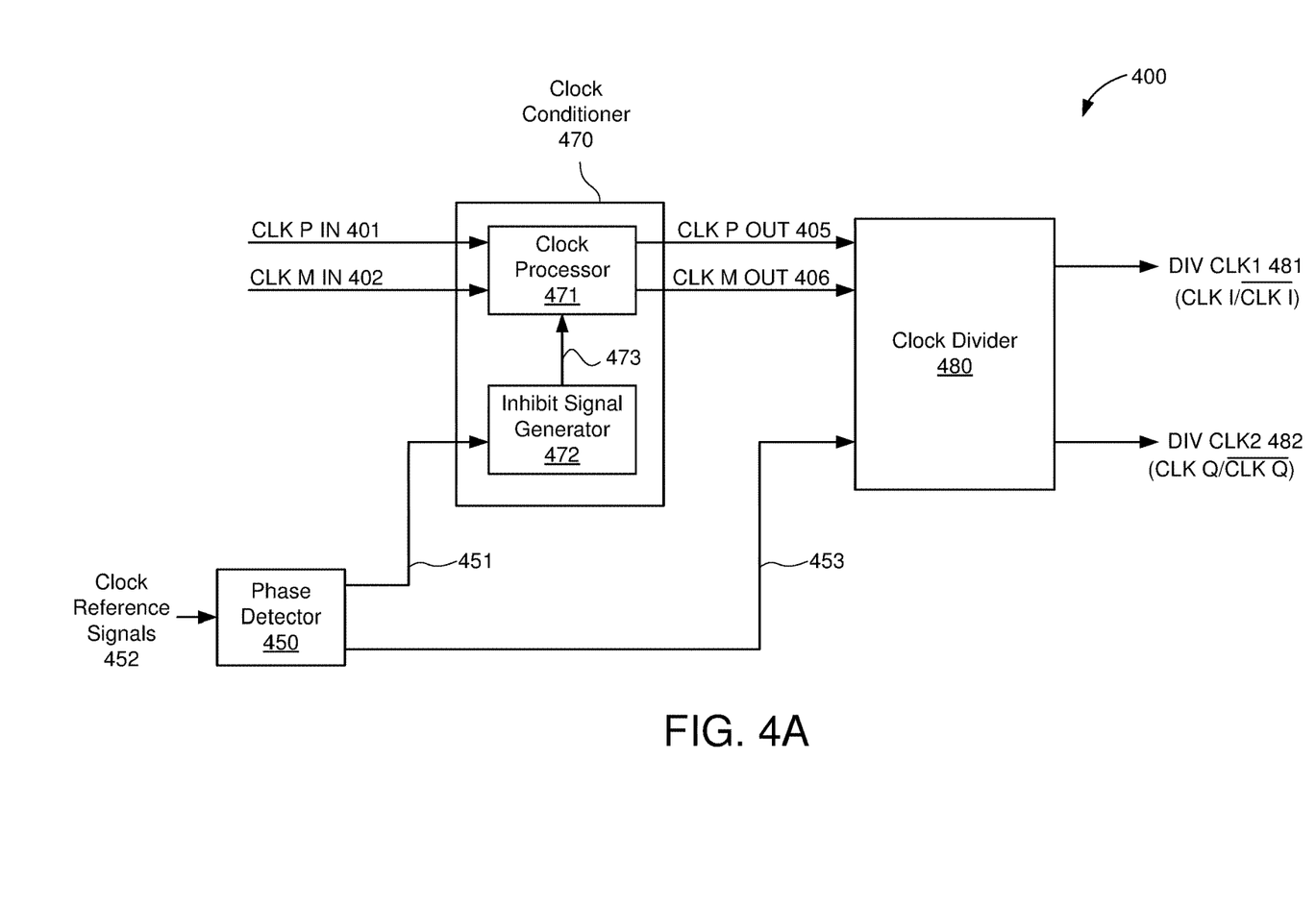
FIG. 4A is a block diagram of a portion of the LO distribution circuit of FIG. 3.

FIG. 4A is a block diagram 400 of a portion of the LO distribution circuit 300 of FIG. 3. The block diagram 400 includes a clock conditioner 470, a clock divider circuit 480, and a phase detector 450. The clock conditioner 470 may be an example embodiment of the first clock conditioner 360, the second clock conditioner 380, the third clock conditioner 361, and/or the fourth clock conditioner 381 of FIG. 3. The clock divider circuit 480 may be an example embodiment of the first clock divider circuit 370, the second clock divider circuit 390, the third clock divider circuit 371, and/or the fourth clock divider circuit 391 of FIG. 3. The phase detector 450 may be an example embodiment of the phase detector 350 of FIG. 3.

The clock conditioner 470 may receive a CLK P IN signal 401 and a CLK M IN signal 402, and may generate a CLK P OUT signal 405 and a CLK M OUT signal 406. In some embodiments, the CLK P IN signal 401 and the CLK M IN signal 402 may be provided by a separate clock divider (e.g., the first clock divider circuit 370 and/or the third clock divider circuit 371 of FIG. 3). The CLK P IN signal 401 and the CLK M IN signal 402 may be 180 degrees out of phase (e.g., a 180 degree phase difference) with respect to each other. For example, when the CLK P IN signal 401 is in a logic high state, then the CLK M IN signal 402 may be in a logic low state. In a similar manner, when the CLK P IN signal 401 is in the logic low state, then the CLK M IN signal 402 may be in the logic high state. In other embodiments, the clock conditioner 470 may receive more than two clock signals with phase relationships other than 180 degrees. For example, the clock conditioner 470 may receive four clock signals that may be separated from each other by an approximately 90 degree phase difference.

The clock conditioner 470 may include a clock processor 471 and an inhibit signal generator circuit 472. The clock processor 471 includes input terminals to receive the CLK P IN signal 401 and the CLK M IN signal 402, and includes output terminals to provide output clock signals CLK P OUT 405 and CLK M OUT 406. In operation, the clock processor 471 may either pass the input clocks signals CLK P IN 401 and CLK M IN 402 as output clock signals CLK P OUT 405 and CLK M OUT signal 406, respectively, or may "gate" (e.g., inhibit) at least one clock cycle of the CLK P IN signal 401 and/or the CLK M IN signal 402 to generate the CLK P OUT signal 405 and the CLK M OUT signal 406, respectively. In some aspects, the clock gating function performed by the clock processor 471 may be based on an inhibit signal 473 generated by the inhibit signal generator circuit 472. Operations of the inhibit signal generator circuit 472 may be controlled, at least in part, by a synchronize (SYNC) signal 451 generated by the phase detector 450. Thus, in some embodiments, the CLK P OUT signal 405 may be the CLK P IN signal 401 (e.g., a clock signal pass through) or a gated CLK P IN signal (e.g., a gated clock signal) based on the inhibit signal 473. In a similar manner, the CLK M OUT signal 406 may be either the CLK M IN signal 402 or a gated CLK M IN signal based on the inhibit signal 473. In other embodiments, the CLK P OUT signal 405 and the CLK M OUT signal 406 may be the gated CLK P IN signal and the gated CLK M IN signal, respectively (e.g., instead of switching between gated and non-gated clock signals). Operation of the clock conditioner 470 is described in more detail below in conjunction with FIG. 5.

The phase detector 450 may generate the SYNC signal 451 based on a phase difference between two or more reference signals 452. The reference signals 452 may include clock signals from two or more transceivers included within the wireless device 102. For example, the reference signals 452 may include clock signals provided to the first transceiver 120 and to the second transceiver 121 of FIG. 1. In some embodiments, the phase detector 450 may determine when clock signals provided to separate transceivers are out of phase with respect to each other. For example, the SYNC signal 451 may be asserted when a phase difference is detected between different clock signals within the reference signals 452 and/or when the detected phase difference is greater than an amount. In some aspects, the amount may be predetermined. Operation of the phase detector 450 is described in more detail below in conjunction with FIG. 4B.

The clock divider circuit 480 receives the CLK P OUT signal 405 and the CLK M OUT signal 406 from the clock conditioner 470, and in response thereto may generate a plurality of frequency divided signals. For one example, the clock divider circuit 480 may generate a DIV CLK1 signal 481 that is one-half the frequency of the CLK P OUT signal 405, and may generate a DIV CLK2 signal 482 that is one-half the frequency of the CLK M OUT signal 406. For another example, the clock divider circuit 480 may generate an in-phase clock signal and a quadrature clock signal to modulate and/or demodulate communication signals based on the CLK P OUT signal 405 and/or the CLK M OUT signal 406. The quadrature clock signal may be separated by (and in some cases lag) the in-phase clock signal by approximately 90 degrees. In some embodiments, the in-phase clock signal and the quadrature clock signal may be differential signals. Thus, the DIV CLK1 signal 481 may be a differential in-phase clock signal including a CLK I signal and a $\overline{\text{CLKI}}$ signal, and the DIV CLK2 signal 482 may be a differential quadrature clock signal including a CLK Q signal and a $\overline{\text{CLKQ}}$ signal.

The plurality of the frequency divided signals generated by the clock divider circuit 480 may be generated based on a selected clock divider reference signal. The clock divider reference signal may be selected by a clock select signal 453. For one example, if the clock divider reference signal is the CLK P OUT signal 405, then the DIV CLK1 signal 481 and/or the DIV CLK2 signal 482 may be generated based on the CLK P OUT signal 405. For another example, if the clock divider reference signal is the CLK M OUT signal 406, then the DIV CLK1 signal 481 and/or the DIV CLK2 signal 482 may be generated based on the CLK M OUT signal 406. Different frequency divided signals may be generated based on different clock divider reference signals. For one example, the DIV CLK1 signal 481 may be generated based on the CLK P OUT signal 405, and the DIV CLK2 signal 482 may be generated based on the CLK M OUT signal 406. For another example, the DIV CLK1 signal 481 may be generated based in the CLK M OUT signal 406, and the DIV CLK2 signal 482 may be generated based on the CLK P OUT signal 405.

In some embodiments, selection of the clock divider reference signal may also be controlled, at least in part, by the inhibit signal 473. For example, the clock divider reference signal may change from a first reference signal to a second reference signal when the inhibit signal 473 is asserted (e.g., to logic high). Controlling when the clock divider reference signal is changed may also control an amount of phase shift that may be applied to the DIV CLK1 signal 481 and/or to the DIV CLK2 signal 482. In some embodiments, the clock select signal 453 may be changed when the inhibit signal 473 is asserted, thereby rendering the monitoring of the inhibit signal 473 unnecessary by the clock divider circuit 480. Operation of the clock divider circuit 480 is described in more detail below in conjunction with FIGS. 5 and 6.

Figure 4B:
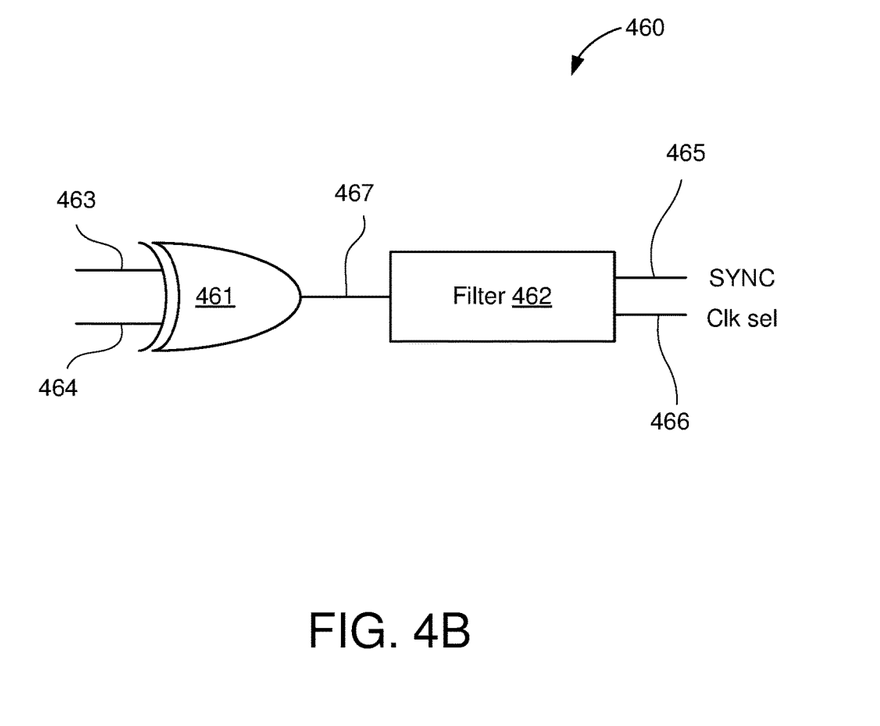
FIG. 4B is a simplified diagram of a phase detector.

FIG. 4B is a simplified diagram of a phase detector 460. The phase detector 460 may be an example embodiment of the phase detector 450 of FIG. 4A. The phase detector 460 may generate one or more phase difference signals to indicate phase differences between two reference signals. The phase detector 460 may include an exclusive OR (XOR) gate 461 and a filter 462. The XOR gate 461 may receive two different reference signals from two different transmitters. For example, the XOR gate 461 may receive a first clock signal 463 from the first transceiver 120, and may receive a second clock signal 464 from the second transceiver 121 (transceivers 120 and 121 not shown in FIG. 4B for simplicity). In some embodiments, the first clock signal 463 and the second clock signal 464 may be divided LO clock signals. Persons skilled in the art will recognize that if both the first clock signal 463 and the second clock signal 464 provided to the XOR gate 461 are of the same logic state, then the XOR gate 461 drives the XOR gate's output signal 467 to logic low (e.g., to a logic zero state). However, if the first clock signal 463 and the second clock signal 464 are of different logic states, then the XOR gate 461 drives the XOR gate output signal 467 to logic high (e.g., to a logic one state). Thus, if the phases of the first clock signal 463 and the second clock signal 464 are the same, then the XOR gate output signal 467 will be a logical zero. On the other hand, if there is a phase difference between the first clock signal 463 and the second clock signal 464, then the XOR gate output signal 467 will be logical one. Thus, the XOR gate output signal 467 may be a phase difference signal indicative of a phase difference between the first clock signal 463 and the second clock signal 464.

The XOR gate 461 is coupled to the filter 462. The filter 462 may be a low pass filter that may integrate the XOR gate output signal 467. A phase difference between the first clock signal 463 and the second clock signal 464 may be determined by measuring a voltage of the integrated XOR gate output signal. In some embodiments, the filter 462 may generate a SYNC signal 465 and/or a clock select signal 466 based on when the integrated XOR gate output signal meets and/or exceeds different voltage thresholds.

Figure 5:
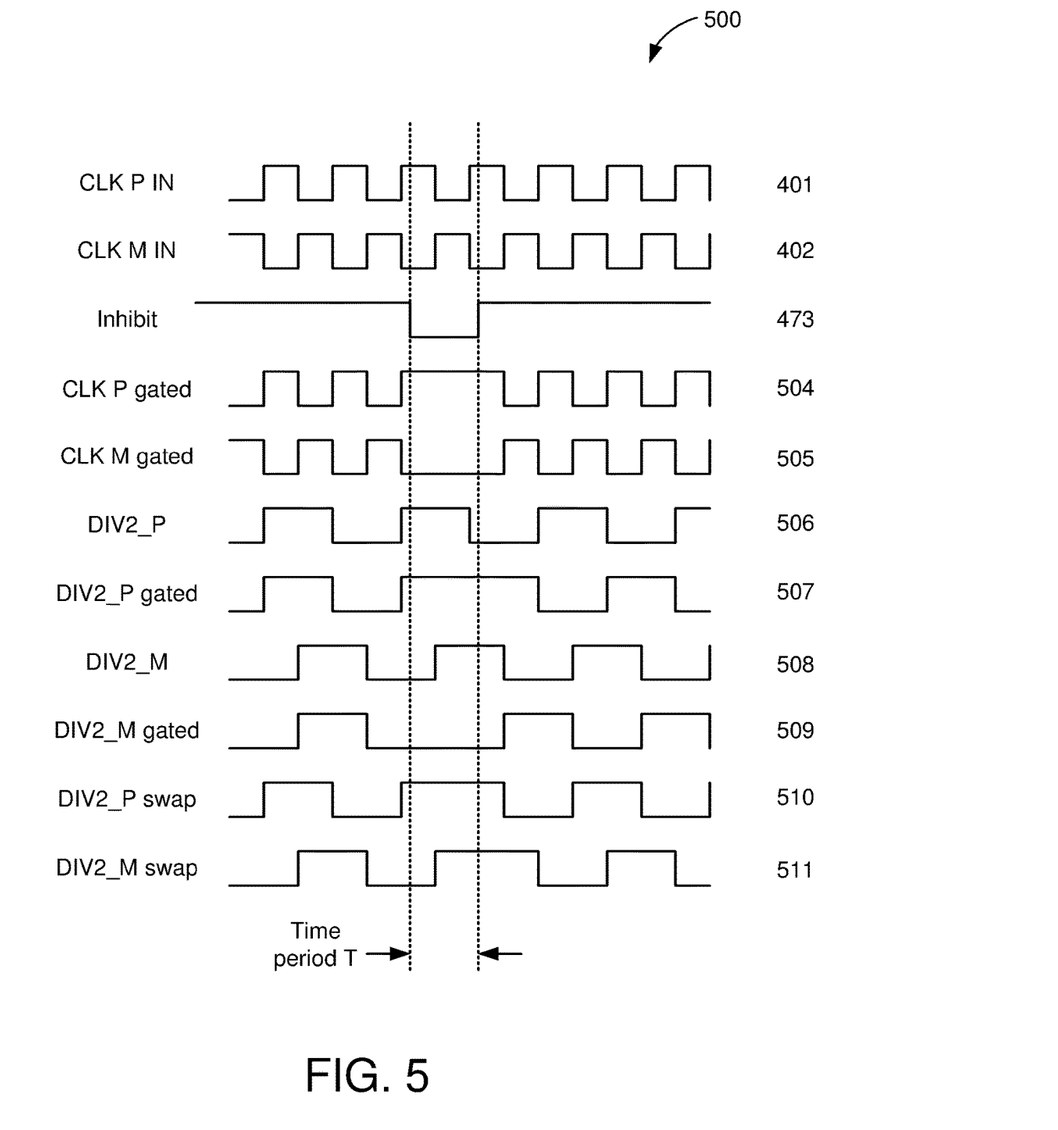
FIG. 5 is a timing diagram depicting example waveforms associated with the LO distribution circuit of FIG. 4A.

FIG. 5 is a timing diagram 500 depicting example waveforms associated with the LO distribution circuit of FIG. 4A. Referring also to FIG. 4A, the clock conditioner 470 may receive the CLK P IN signal 401 and the CLK M IN signal 402, which as described above may be 180 degrees out of phase with respect to each other. The inhibit signal 473 may cause the clock processor 471 to gate (inhibit) at least one clock cycle of the CLK P IN signal 401 and/or the CLK M IN signal 402 during a time period T. A CLK P gated signal 504 may be generated by inhibiting one of the clock cycles of the CLK P IN signal 401, and a CLK M gated signal 505 may be generated by inhibiting one of the clock cycles of the CLK P IN signal 402. Clock cycle gating is illustrated in the timing diagram 500 during the time period T.

For example, prior to the time period T, the CLK P gated signal 504 may be similar to the CLK P IN signal 401, and the CLK M gated signal 505 may be similar to the CLK M IN signal 402. The inhibit signal 473, which is active low in the example of FIG. 5, may be asserted during the time period T. When the inhibit signal 473 is asserted, the CLK P gated signal 504 and the CLK M gated signal 505 remain steady. In other words, the CLK P gated signal 504 and the CLK M gated signal 505 do not change logic states, but instead remain at a constant signal level—thereby allowing a clock cycle to be inhibited. After the inhibit signal 473 is de-asserted, then the CLK P gated signal 504 and the CLK M gated signal 505 may again be similar to the CLK P IN signal 401 and the CLK M IN signal 402, respectively. Although the inhibit signal 473 is depicted as an active low signal in the example of FIG. 5, in other embodiments, the inhibit signal 473 may be an active high signal (not shown for simplicity).

As described above, the CLK P OUT signal 405 may be the CLK P IN signal 401 (e.g., during a pass-through mode of the clock processor 471) or may be the CLK P gated signal 504 (e.g., during an inhibit mode of the clock processor 471). In a similar manner, the CLK M OUT signal 406 may be the CLK M IN signal 401 (e.g., during the pass-through mode of the clock processor 471) or may be the CLK M gated signal 505 (e.g., during the inhibit mode of the clock processor 471).

As described above with respect to FIG. 4A, the clock divider circuit 480 may generate frequency divided signals based on a selected clock divider reference signal. For example, the clock divider reference signal may be the CLK P OUT signal 405 or the CLK M OUT signal 406. Thus, the DIV CLK1 signal 481 and/or the DIV CLK2 signal 482 may be based on the CLK P OUT signal 405 or the CLK M OUT signal 406. It is noted that the CLK P OUT signal 405 may be either the CLK P IN signal 401 or the CLK P gated signal 504, and the CLK M OUT signal 406 may be either the CLK M IN signal 402 or the CLK M gated signal 505. Therefore, the generated DIV CLK1 signal 481 and the DIV CLK2 signal 482 may "shift" in accordance with the selected clock divider reference signal.

When the CLK P IN signal 401 is the clock divider reference signal, a DIV2_P signal 506 may be generated, as depicted in FIG. 5. The DIV2_P signal 506 may be a frequency divided (e.g., a one half frequency) signal that may change logic states based on rising edges of the CLK P IN signal 401. In contrast, when the CLK P gated signal 504 is the clock divider reference signal, a DIV2_P gated signal 507 may be generated as depicted in FIG. 5. The DIV2_P gated signal 507 may change logic states based on the rising edges of the CLK P gated signal 504. It is noted that the DIV2_P gated signal 507 does not change logic states during the time period T. As a result, the DIV2_P gated signal 507 may have a 180 degree phase relationship to the DIV2_P signal 506 after time period T. Thus, when the clock divider reference signal is the CLK P gated signal 504, the DIV2_P gated signal 507 may be phase-shifted 180 degrees with respect to the DIV2_P signal 506. In some embodiments, a DIV2_M signal 508 and a DIV2_M gated signal 509 may be similarly generated based on the CLK M IN signal 402 and the CLK M gated signal 505. Thus, the DIV CLK1 signal 481 and the DIV CLK2 signal 482 may be based on the DIV2 P signal 506, the DIV2 P gated signal 507, the DIV2_M signal 508 and/or the DIV2_M gated signal 509.

As described above, when the clock divider reference signal is the CLK P gated signal 504, the DIV2_P gated signal 507 may be phase-shifted 180 degrees with respect to the DIV2_P signal 506. In some instances, a 90 degree phase difference between reference clock signals may be desired instead of a 180 degree phase difference. In some embodiments, to provide the 90 degree phase shift, the clock divider circuit 480 may change the clock divider reference signal during the time period T when the inhibit signal 473 is asserted. For example, a DIV2_P SWAP signal 510 may be generated based on the CLK P gated signal 504 before the time period T, and may be generated based on the CLK M gated signal 505 after the time period T. In other words, the clock divider reference signal may change from the DIV2 P gated signal 507 to the DIV2 M gated signal 509 when the inhibit signal 473 is asserted. It is noted that the DIV2_P swap signal 510 lags the DIV2_P signal 506 by 90 degrees. In some embodiments, although not shown for simplicity, the clock divider reference signal may be selected by the clock select signal 453. In some embodiments, a DIV2_M swap signal 511 may be generated in a similar manner. Thus, the DIV CLK1 signal 481 and the DIV CLK2 signal 482 may each be one of the DIV2_P signal 506, the DIV2_P gated signal 507, the DIV2_P swap signal 510, the DIV2_M signal 508, the DIV2_M gated signal 509, or the DIV2_M swap signal 511. In some embodiments, the DIV CLK1 481 and the DIV CLK2 482 signals may be generated contemporaneously as described below in conjunction with FIG. 6.

Figure 6:
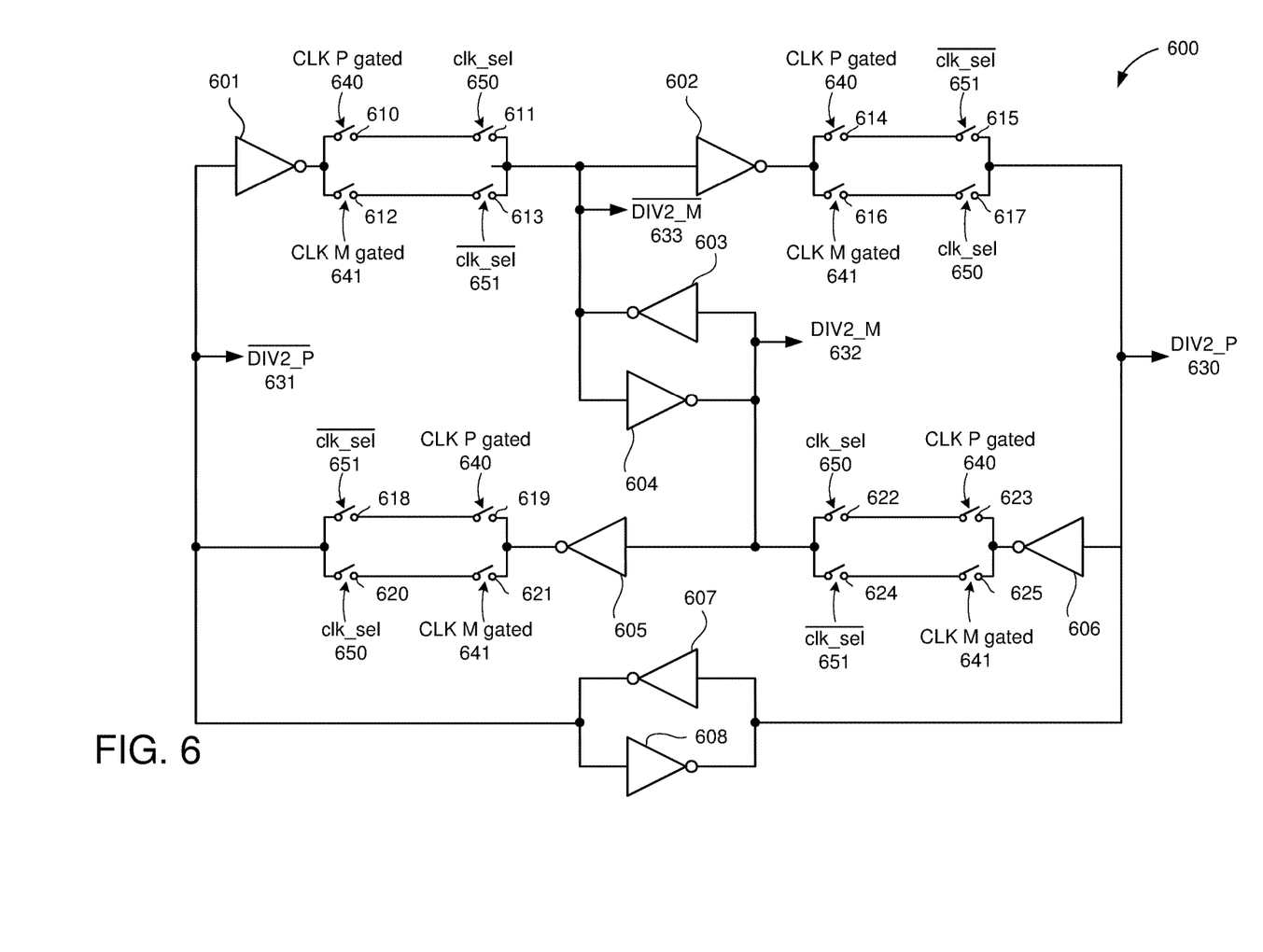
FIG. 6 is a schematic diagram of a clock divider in accordance with example embodiments.

FIG. 6 is a schematic diagram of a clock divider 600, in accordance with some embodiments. The clock divider 600 may be an example embodiment of the clock divider circuit 480 of FIG. 4. The clock divider 600 may include presettable inverters 601-608 and switches 610-625. The clock divider 600 may generate divided and synchronized clock signals that may be used by transceivers within a wireless. For example, the clock divider 600 may generate a DIV2_P signal 630, a $\overline{DIV2\_P}$ signal 631, a DIV2_M signal 632, and a $\overline{DIV2\_M}$ signal 633 to modulate and/or demodulate communication signals within a transceiver. The clock divider 600 may generate differential clock signals. Therefore, the DIV2_P signal 630 may be an inverse clock signal with respect to the $\overline{DIV2\_P}$ signal 631, and the DIV2_M signal 632 may be an inverse clock signal with respect to the $\overline{DIV2\_M}$ signal 633. In another example, the clock divider 600 may generate CLK I/$\overline{CLKI}$ and CLK Q/$\overline{CLKQ}$ signals (not shown for simplicity). The clock divider 600 may receive a CLK P gated signal 640, a CLK M gated signal 641, a clock select (clk_sel) signal 650, and a $\overline{clk\_sel}$ signal 651. The CLK P gated signal 640 and the CLK M gated signal 641 may be similar to the CLK P gated signal 504 and the CLK M gated signal 505 of FIG. 5, respectively. The clk_sel signal 650 may be similar to the clock select signal 453 of FIG. 4, and the $\overline{clk\_sel}$ signal 651 may be a logical inverse of the clk_sel signal 650.

One or more of the presettable inverters 601-608 may be preset to an initial state based on the state of the CLK P gated signal 640, the CLK M gated signal 641, the clk_sel signal 650, and the $\overline{clk\_sel}$ signal 651. The initial state may determine an initial (e.g., quadrature) relationship between the DIV2_P signal 630, the $\overline{DIV2\_P}$ signal 631, the DIV2_M signal 632, and the $\overline{DIV2\_M}$ signal 633. In addition, one or more of the presettable inverters 601-608 may be configured to operate together as a ring oscillator. The switches 610-625 may be controlled by one or more signals. For example, switches 611, 617, 620, and 622 may be closed when the clk_sel signal 650 is asserted. The switches 613, 615, 618, and 624 may be closed when the $\overline{clk\_sel}$ signal 651 is asserted. The switches 610, 614, 619, and 623 may be closed when the CLK P gated signal 640 is asserted, and the switches 612, 616, 621 and 625 may be closed when the CLK M gated signal 641 is asserted.

As described above with respect to FIGS. 4A, 4B, and 5, the clk_sel signal 650 (and therefore also the $\overline{clk\_sel}$ signal 651) may be used to generate the divider clock reference signal. For the example of FIG. 6, if the clk_sel signal 650 is asserted, then switches 611, 617, 620, and 622 are closed. Thus, the CLK P gated signal 640 may determine the $\overline{DIV2\_M}$ signal 633 via switches 610-611, and may determine the DIV2_M signal 632 via switches 622-623. The CLK M gated signal 641 may determine the DIV2_P signal 630 via switches 616-617, and may determine the $\overline{DIV2\_P}$ signal 631 via switches 620-621.

If, on the other hand, the $\overline{clk\_sel}$ signal 651 is asserted, then the switches 613, 615, 618, and 624 are closed. Thus, the CLK M gated signal 641 may determine the $\overline{DIV2\_M}$ signal 633 via switches 612-613, and may determine the DIV2_M signal 633 via switches 624-625. The CLK P gated signal 640 may determine the DIV2 P signal 630 via switches 614-615, and may determine the $\overline{DIV2\_P}$ signal 631 via switches 618-619.

Figure 7:
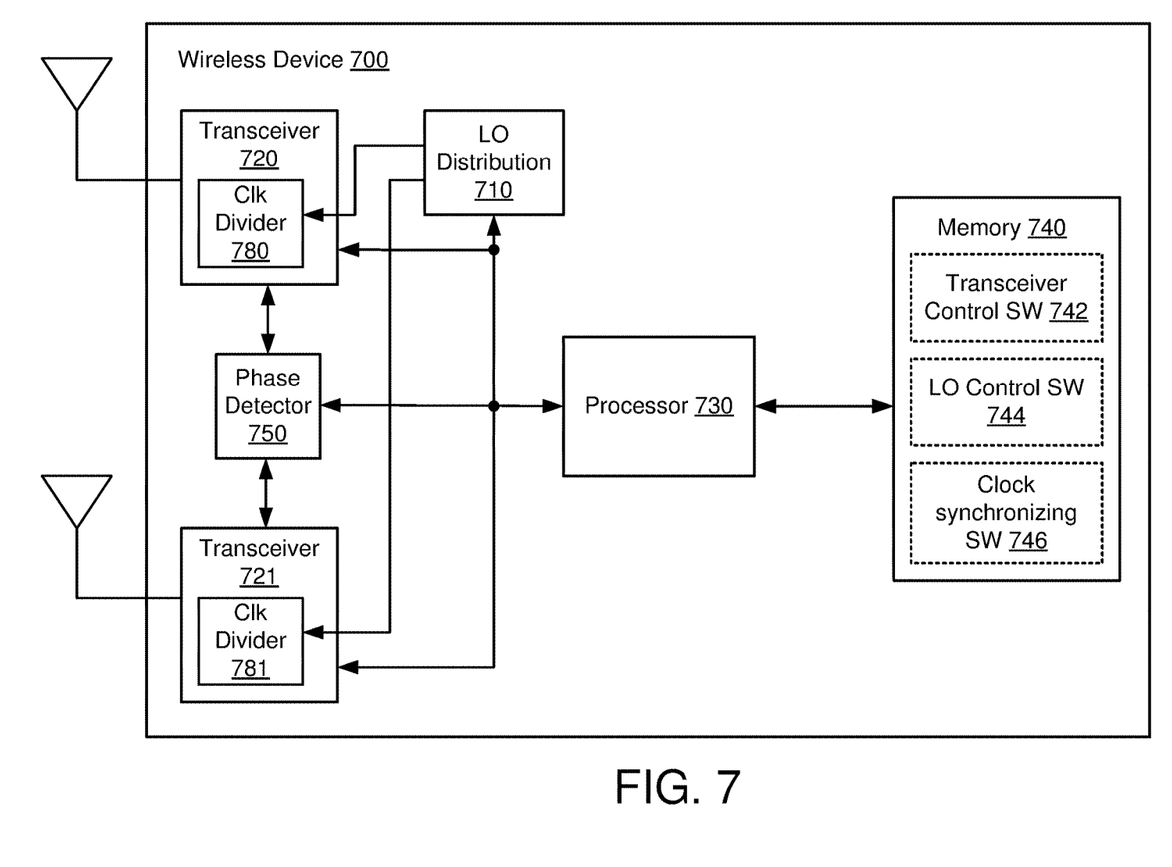
FIG. 7 depicts a wireless device that is another example embodiment of the wireless device of FIG. 1.

FIG. 7 depicts a wireless device 700 that is another example embodiment of the wireless device 102 of FIG. 1. Wireless device 700 may include an LO distribution circuit 710, a first transceiver 720, a second transceiver 721, a processor 730, a memory 740, and a phase detector 750. The phase detector 750 may be an example embodiment of the phase detector 350 of FIG. 3 and/or the phase detector 450 of FIG. 4. The first transceiver 720 may include a first clock divider circuit 780, and the second transceiver 721 may include a second clock divider circuit 781. The first clock divider circuit 780 and the second clock divider circuit 781 may be example embodiments of the first configurable clock divider 330 and/or the second configurable clock divider 340 of FIG. 3.

The LO distribution circuit 710 may be coupled to the first transceiver 720, the second transceiver 721, and the processor 730. The LO distribution circuit 710 may generate an LO signal as directed by the processor 730. In addition, the LO distribution circuit 710 may divide the LO signal and distribute the divided LO signal to the first transceiver 720 and the second transceiver 721. The LO distribution circuit 710 may include circuits to synthesize, divide, buffer, and/or distribute the divided LO signal (not shown for simplicity).

The first transceiver 720 may transmit and/or receive communication signals based, at least in part, on the divided LO signal provided by the LO distribution circuit 710. The first transceiver 720 may include a first clock divider circuit 780. The first clock divider circuit 780 may further divide the divided LO signal based on synchronization signals (e.g., SYNC and/or clock select signals) provided by the phase detector 750. The second transceiver 721 may be similar to the first transceiver 720. For example, the second transceiver 721 may also transmit and/or receive communication signals based on the divided LO signal provided by the LO distribution circuit 710. The second transceiver may include a second clock divider circuit 781 to further divide the divided LO signal from the LO distribution circuit 710.

The phase detector 750 may be coupled to the first transceiver 720, the second transceiver 721, and the processor 730. The phase detector 750 may receive clock signals such as, for example, divided LO clock signals from the first transceiver 720 and the second transceiver 721. The phase detector 750 may determine whether the divided LO clock signals from the first transceiver 720 and from the second transceiver 721 are in phase or out of phase. For example, the phase detector 750 may determine that the divided LO clock signal from the first transceiver 720 is out of phase with respect to the divided LO clock signal from the second transceiver 721. In some embodiments, the phase detector 750 may also determine an amount of phase difference between the divided LO clock signal from the first transceiver 720 and the divided LO clock signal from the second transceiver 721. For example, the phase detector 750 may determine that the divided LO clock signal from the second transceiver 721 is 90 degrees out of phase with respect to the divided LO clock signal from the first transceiver 720.

Memory 740 may include a non-transitory computer-readable storage medium (e.g., one or more nonvolatile memory elements, such as EPROM, EEPROM, Flash memory, a hard drive, etc.) that may store the following software modules:

a transceiver control software (SW) module 742 to control signal transmission and reception through the first transceiver 720 and the second transceiver 721;

an LO control SW module 744 to control the LO clock generation and distribution; and a clock synchronizing SW module 746 to synchronize clock signals within the first transceiver 720 and the second transceiver 721.

Each software module includes program instructions that, when executed by the processor 730, may cause the wireless device 700 to perform the corresponding function(s). Thus, the non-transitory computer-readable storage medium of the memory 740 may include instructions for performing all or a portion of the operations described below with respect to FIG. 8.

Processor 730, which is coupled to the first transceiver 720, the second transceiver 721, the LO distribution circuit 710, and the phase detector 750, may be any suitable one or more processors capable of executing scripts or instructions of one or more software programs stored in the wireless device 700 (e.g., within the memory 740).

The processor 730 may execute the transceiver control SW module 742 to cause the first transceiver 720 and/or the second transceiver 721 to each transmit and/or receive RF signals. In some embodiments, executing the transceiver control SW module 742 may cause the first transceiver 720 and/or the second transceiver 721 to transmit and/or receive communication signals in specific channels and/or frequencies.

The processor 730 may execute the LO control SW module 744 to control frequencies of one or more clock signals generated by the LO distribution circuit 710. For example, executing the LO control SW module 744 may cause one or more LO clock signals to be generated to transmit and/or receive an RF signal in a specific channel and/or frequency. In addition, executing the LO control SW module 744 may cause one or more clock signals to be divided and/or distributed to the first transceiver 720 and the second transceiver 721.

The processor 730 may execute the clock synchronizing SW module 746 to synchronize clock signals between the first transceiver 720 and the second transceiver 721. In some embodiments, the phase detector 750 may determine a phase difference between clock signals within the first transceiver 720 and the second transceiver 721, and/or may generate synchronizing signals for the LO distribution circuit 710, the first transceiver 720, and/or the second transceiver 721 to synchronize the two or more clock signals. In other embodiments, the processor 730 may execute the clock synchronizing SW module 746 to generate the synchronizing signals. The processor 730 may also execute the clock synchronizing SW module 746 to cause a clock signal to delay, shift, and/or invert via the first clock divider circuit 780 and/or the second clock divider circuit 781 to synchronize the two or more clock signals.

Figure 8:
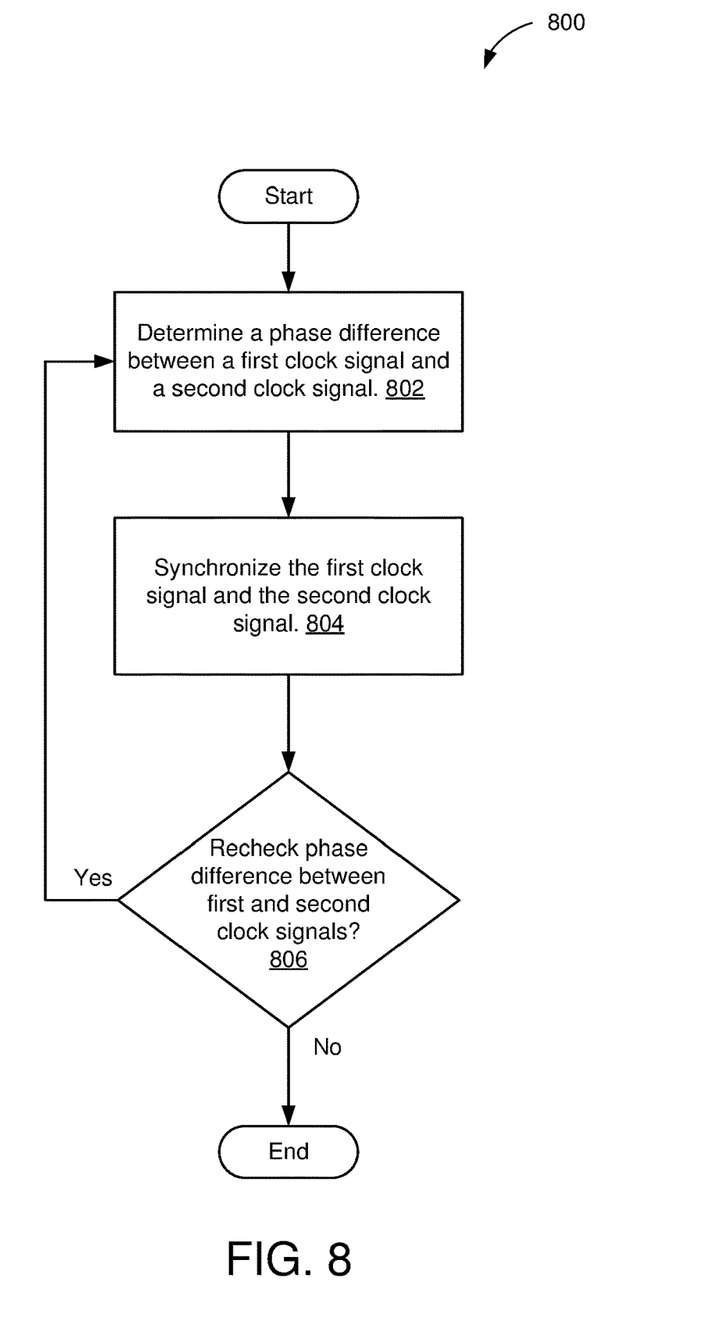
FIG. 8 shows an illustrative flow chart depicting an example operation for operating a wireless device, in accordance with example embodiments.

FIG. 8 shows an illustrative flow chart depicting an example operation 800 for operating a wireless device, in accordance with some embodiments. Some embodiments may perform the operations described herein with additional operations, fewer operations, operations in a different order, operations in parallel, and/or some operations differently. Referring also to FIG. 3, a phase difference between a first clock signal and a second is determined (802). In some embodiments, the phase difference between a first divided LO clock signal and a second divided LO clock signal may be determined by the phase detector 350. The phase detector 350 also determine an amount of phase difference between the first clock signal and the second clock signal.

Next, the first clock signal and the second clock signal may be synchronized (804). For example, a SYNC signal and/or a clock select signal may be generated based on the determined phase difference between the first and the second clock signals. The SYNC and/or clock select signals may be provided to clock dividers, such as the first configurable clock divider 330 or the second configurable clock divider 340. In response to the SYNC and/or the clock select signals, the first clock signal may be delayed, shifted, and/or inverted with respect to the second clock signal. In a similar manner, the second clock signal may be delayed, shifted, and/or inverted with respect to the first clock signal.

Next, the phase difference between first clock signal and the second clock signal is rechecked (806). In some embodiments, the phase difference between the first clock signal and the second clock signal may be checked periodically and/or prior to every RF transmission. If the phase difference between first clock signal and the second clock signal is to be rechecked, then the operation proceeds to 802. If the first clock signal and the second clock signal are not to be rechecked, then the operation ends.

In the foregoing specification, the example embodiments have been described with reference to specific exemplary embodiments thereof. It will, however, be evident that various modifications and changes may be made thereto without departing from the broader scope of the disclosure as set forth in the appended claims. The specification and drawings are, accordingly, to be regarded in an illustrative sense rather than a restrictive sense.

What is claimed is:

1. An apparatus comprising:
 a first circuit configured to:
  generate a clock inhibit signal; and
  generate a first clock divider reference signal and a second clock divider reference signal, wherein the first clock divider reference signal is phase offset with respect to the second clock divider reference signal and at least one cycle of the first clock divider reference signal and the second clock divider reference signal is inhibited when the clock inhibit signal is asserted; and
 a second circuit configured to:
  receive the first clock divider reference signal and the second clock divider reference signal;
  select a clock signal from one of the first clock divider reference signal or the second clock divider reference signal based on a clock select signal; and
  divide the selected clock signal in frequency to generate a divided clock signal, wherein the divided clock signal is based, at least in part, on the clock inhibit signal.

2. The apparatus of claim 1, wherein the second circuit is configured to select one of the first clock divider reference signal or the second clock divider reference signal when the clock inhibit signal is asserted.

3. The apparatus of claim 2, wherein the second circuit is further configured to select one of the first clock divider reference signal or the second clock divider reference signal based, at least in part, on a detected phase difference between a first reference signal and a second reference signal.

4. The apparatus of claim 3, wherein the divided clock signal has at least one of an approximately 90 degree phase difference or an approximately 180 degree phase difference with respect to the first reference signal.

5. The apparatus of claim 4, wherein the second reference signal is based, at least in part, on the divided clock signal.

6. The apparatus of claim 3, wherein the first reference signal and the second reference signal are based, at least in part, on a local oscillator clock signal.

7. The apparatus of claim 1, wherein the first clock divider reference signal and the second clock divider reference signal are gated clock signals each having at least one clock cycle inhibited based on the clock inhibit signal.

8. The apparatus of claim 1, wherein the phase offset between the first clock divider reference signal and the second clock divider reference signal is approximately 180 degrees.

9. The apparatus of claim 1, wherein the divided clock signal comprises an in-phase divided clock signal and a quadrature divided clock signal related by a phase-shift of approximately 90 degrees.

10. A method for synchronizing a first clock signal and a second clock signal, the method comprising:
generating a clock inhibit signal;
generating a first clock divider reference signal and a second clock divider reference signal, wherein the first clock divider reference signal is phase offset with respect to the second clock divider reference signal and at least one cycle of the first clock divider reference signal and the second clock divider reference signal is inhibited when the clock inhibit signal is asserted;
selecting a clock signal from one of the first clock divider reference signal or the second clock divider reference signal based on a clock select signal; and
dividing the selected clock signal in frequency thereby generating a divided clock signal, wherein the divided clock signal is based, at least in part, on the clock inhibit signal.

11. The method of claim 10, further comprising:
selecting one of the first clock divider reference signal or the second clock divider reference signal when the clock inhibit signal is asserted.

12. The method of claim 11, further comprising:
selecting one of the first clock divider reference signal or the second clock divider reference signal based, at least in part, on a detected phase difference between a first reference signal and a second reference signal.

13. The method of claim 12, wherein the divided clock signal has at least one of an approximately 90 degree phase difference or an approximately 180 degree phase difference with respect to the first reference signal.

14. The method of claim 12, wherein the second reference signal is based, at least in part, on the divided clock signal.

15. The method of claim 12, wherein the first reference signal and the second reference signal are based, at least in part, on a local oscillator clock signal.

16. The method of claim 10, wherein the first clock divider reference signal and the second clock divider reference signal are gated clock signals each having at least one clock cycle inhibited based on the clock inhibit signal.

17. An apparatus comprising:
means for generating a clock inhibit signal;
means for generating a first clock divider reference signal and a second clock divider reference signal, wherein the first clock divider reference signal is phase offset with respect to the second clock divider reference signal and at least one cycle of the first clock divider reference signal and the second clock divider reference signal is inhibited when the clock inhibit signal is asserted;
means for selecting a clock signal from one of the first clock divider reference signal or the second clock divider reference signal based on a clock select signal; and
means for dividing the selected clock signal in frequency thereby generating a divided clock signal, wherein the divided clock signal is based, at least in part, on the clock inhibit signal.

18. The apparatus of claim 17, wherein the means for selecting the clock signal comprises:
selecting one of the first clock divider reference signal or a second clock divider reference signal when the clock inhibit signal is asserted.

19. The apparatus of claim 17, wherein the means for selecting the clock signal comprises:
selecting one of the first clock divider reference signal or the second clock divider reference signal based, at least in part, on a detected phase difference between a first reference signal and a second reference signal.

20. The apparatus of claim 19, wherein the divided clock signal has at least one of an approximately 90 degree phase difference or an approximately 180 degree phase difference with respect to the first reference signal.

21. The apparatus of claim 20, wherein the second reference signal is based, at least in part, on the divided clock signal.

* * * * *